(12) United States Patent
Bakke et al.

(10) Patent No.: US 7,898,071 B2
(45) Date of Patent: Mar. 1, 2011

(54) APPARATUS AND METHOD FOR HOUSING MICROMECHANICAL SYSTEMS

(75) Inventors: Thor Bakke, Dresden (DE); Thilo Sandner, Dresden (DE)

(73) Assignee: Faunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 401 days.

(21) Appl. No.: 11/971,371

(22) Filed: Jan. 9, 2008

(65) Prior Publication Data
US 2008/0164592 A1 Jul. 10, 2008

(30) Foreign Application Priority Data
Jan. 10, 2007 (DE) .................. 10 2007 001 518

(51) Int. Cl.
*H01L 23/006* (2006.01)
(52) U.S. Cl. ......... 257/684; 257/680; 257/698; 257/729; 257/E23.001; 257/E23.018; 257/E21.007
(58) Field of Classification Search .......... 257/678–733, 257/E23.001–E23.194, 641–644, E21.007
See application file for complete search history.

(56) References Cited

U.S. PATENT DOCUMENTS

| | | | |
|---|---|---|---|
| 4,688,052 A | 8/1987 | Inamoto et al. | |
| 5,196,919 A * | 3/1993 | Miyauchi et al. | 257/704 |
| 6,384,473 B1 * | 5/2002 | Peterson et al. | 257/680 |
| 7,102,224 B2 | 9/2006 | Pahl | |
| 7,294,925 B2 * | 11/2007 | Choi et al. | 257/710 |
| 7,582,969 B2 * | 9/2009 | Carlson et al. | 257/758 |
| 2005/0227401 A1 | 10/2005 | Lee et al. | |
| 2007/0284681 A1 * | 12/2007 | Massieu et al. | 257/415 |
| 2009/0008682 A1 | 1/2009 | Kusunoki et al. | |

FOREIGN PATENT DOCUMENTS

| | | |
|---|---|---|
| CN | 1683234 A | 10/2005 |
| DE | 196 02 318 C1 | 8/1997 |
| DE | 199 40 512 A1 | 3/2001 |
| WO | 2006/040986 A1 | 4/2006 |

OTHER PUBLICATIONS

Cohn et al: "MEMS Packaging on a Budget (Fiscal and Thermal)," IEEE Conference on Electronics; Circuits and Systems; 2002; pp. 287-290.
Kim et al.: "A Low Temperature, Hermetic Water Level Packaging Method for RF MEMS Switch," 2005 Electronic Components and Technology Conference; IEEE; 2005; pp. 1103-1108.
Kaajakari et al.: "Stability of Wafer Level Vacuum Encapsulated Silicon Resonators," 2nd International Workshop on Wafer Bonding for MEMS Technologies, Halle/Saale Germany; Apr. 9-11, 2006; pp. 42-47.
Lin: "MEMS Post-Packaging by Localized Heating and Bonding," IEEE Transactions on Advanced Packaging, vol. 23; No. 4; Nov. 2000; pp. 608-616.
Monajemi, "A Low Cost Wafer-Level MEMS Packaging Technology," IEEE MEMS;2005; pp. 634-637.

(Continued)

*Primary Examiner* — Jasmine J Clark
(74) *Attorney, Agent, or Firm* — Keating & Bennett, LLP

(57) ABSTRACT

An apparatus for housing a micromechanical system includes a substrate with a surface on which the micromechanical system is formed, a transparent cover and a dry film layer arrangement between the surface of the substrate and the transparent cover. The dry film layer arrangement has an opening, so that the micromechanical system adjoins the opening.

23 Claims, 3 Drawing Sheets

OTHER PUBLICATIONS

Chiang et al.: "A Wafer-Level Microcap Array to Enable High-Yield Microsystem Packaging," IEEE Transactions on Advanced Packaging; vol. 27; No. 3; Aug. 2004; pp. 490-496.

Liang et al.: "A Low Temperature Wafer-Level Hermetic MEMS Package Using UV Curable Adhesive," 2004 IEEE Electronic Components and Technology Conference; 2004; pp. 1486-1491.

Najafi: "Micropackaging Technologies for Integrated Microsystems: Applications to MEMS and MOEMS," Proceedings of SPIE; vol. 4979; 2003; pp. 1-19.

Sparks et al.: "Reliable Vacuum Packaging Using Nanogetters and Glass Frit Bonding," Proceedings of SPIE; vol. 5343; 2004; pp. 70-78.

Klink et al.: "Wafer Bonding With an Adhsive Coating," SPIE; vol. 3514; Sep. 1998; pp. 50-61.

English language translation of an Official Communication issued in corresponding Chinese Patent Application No. 200810002282.3, mailed on Jun. 9, 2010.

* cited by examiner

APPARATUS AND METHOD FOR HOUSING MICROMECHANICAL SYSTEMS

CROSS-REFERENCE TO RELATED APPLICATIONS

This application claims priority from German Patent Application No. 102007001518.8, which was filed on Jan. 10, 2007, and is incorporated herein in its entirety by reference.

TECHNICAL FIELD

The present invention relates to an apparatus and a method for housing a micromechanical system.

BACKGROUND

The housing or the encapsulation of micromechanical systems (Microsystems) may be done both for individual devices and for a wafer, which may comprise a multiplicity of devices. Micromechanical systems often have a moveable mechanical structure, and the present invention concerns an encapsulation of microsystems, using wafers, and particularly such systems where a relatively large cavity is necessary and/or desirable to guarantee flawless functioning by free movement of the micromechanical structure.

So as to ensure long life of the micromechanical systems or of MEMS (micro electromechanical systems) devices, moveable parts need suitable protection by encapsulation or housing. The encapsulation of microsystems is a critical part of the packaging process, which is traditionally performed only after dicing of the devices by a so-called die-by-die process. Encapsulation using wafers typically having a multiplicity of devices opens up the possibility of substantial cost reduction, since particular handling of individual devices is avoided. The encapsulation may be done immediately after the MEMS is finished or enabled, which at the same time offers protection for the device during the ensuing procedural steps, particularly the dicing of the devices. Thus, as a result, simple processing is obtained, and increased overall yield may be achieved.

In the past few years, a series of solutions have been presented, such as in K. Najafi, "Micropackaging technologies for integrated microsystems: applications to MEMS and MOEMS", Proc. SPIE, vol. 4979, 2003. In M. B. Cohn, et al., "MEMS packaging on a budget (fiscal and thermal)", IEEE Conference on Electronics, Circuits and Systems, 2002 and in W. Kim et al., "A low temperature, hermetic wafer level packaging method for RF MEMS switch", IEEE Electronic Components and Technology Conference 2005, hermetic packages using thermal-pressure bonding by means of metal sealing are described; so-called anodic bonds are described in V. Kaajakari, et al., "Stability of wafer level vacuum encapsulated silicon resonators", 2nd International Workshop on Wafer Bonding for MEMS Technologies, Halle/Saale Germany Apr. 9-11, 2006. Bonds utilizing localized heating of metals are presented in L. Lin, "MEMS post-packaging by localized heating and bonding", IEEE Transactions on advanced packaging, vol. 23, no. 4, November 2000, and so-called glass frit bonds in D. Sparks, et al., "Reliable vacuum packaging using NonoGetters™ and glass frit bonding", Proc. SPIE, vol. 5343, 2004. Most of these known solutions necessitate so-called wafer bonding. Alternative solutions, however, are also known, such as the formation of cavities by thermal decomposition of special polymers, see P. Monajemi et al., "A low cost wafer-level MEMS packaging technology", IEEE MEMS 2005.

MEMS devices generally are sensitive with respect to air humidity, which easily develops in changing air conditions and may lead to corrosion and/or static friction. For this reason, encapsulation and/or housing usually is necessary for reliable functioning. Due to the high permeability or penetration of the air humidity, polymer packagings generally are avoided. For really hermetic packagings, metals or glass are used as materials for the housing or the encapsulations as well as for the sealings. Hermetic encapsulations generally are very costly and for example represent 50-80% of the costs for the MEMS devices, see B. Cohn, et al., "MEMS packaging on a budget (fiscal and thermal)", IEEE Conference on Electronics, Circuits and Systems, 2002. Some MEMS devices/systems, such as ones with large mechanical structures or micromachines, are less sensitive with respect to air humidity and therefore do not need expensive hermetic encapsulation. In such applications, a housing, a cover or an encapsulation of polymer material provides sufficient protection during the process of dicing and packaging. Such a solution is an encapsulation structure, such as described in Y.-M. J. Chiang et al., "A wafer-level micro cap array to enable high-yield micro system packaging", IEEE Transactions on Advanced Packaging, vol. 27, no. 3, August 2004, for example, which allows for mass production in great numbers at low costs. The packaging described here is done by means of a mold and is disadvantageous in that high costs for the mold result. A further disadvantage is the optical window for the polymer material used, which has lower optical quality than when using glass, for example. For example, this is a result of the different absorption behavior of glass as compared with a polymer material.

It is a particular challenge to form housings or encapsulations having a large cavity for a MEMS device, so that movement in the range of 10 to 300 µm and more outside a plane is possible. The formation of so-called spacer frames (i.e. layered structures functioning as spacers) in silicon, for example, by potassium hydroxide etching (KOH etching) is possible and/or known, see DE 199 40 512. Structures thus obtained, however, are expensive and inflexible.

SUMMARY

According to an embodiment, an apparatus for housing a micromechanical or a micro-optoelectrical system may have: a substrate with a surface on which the micromechanical system is formed; a transparent cover; and a dry film layer arrangement between the surface of the substrate and the transparent cover, wherein the dry film layer arrangement has an opening, so that the micromechanical system adjoins the opening.

According to another embodiment, a method for housing a micromechanical or micro-optoelectrical system may have the steps of: providing a transparent cover; applying a dry film layer arrangement onto the transparent cover; patterning the dry film layer arrangement to produce an opening; bonding a surface of a substrate on which the micromechanical system is formed to the dry film layer arrangement, so that the micromechanical system adjoins the opening.

According to another embodiment, a system may have an apparatus for housing a micromechanical or a micro-optoelectrical system, wherein the apparatus may have: a substrate with a surface on which the micromechanical system is formed; a transparent cover; and a dry film layer arrangement between the surface of the substrate and the transparent cover, wherein the dry film layer arrangement has an opening, so that the micromechanical system adjoins the opening, wherein the system is a laser-scanning projection display, a barcode reading device, an image pickup, a retina projection display, an optical detector or a spatial light modulator.

The present invention is based on the finding that an apparatus for housing a micromechanical or a micro-optoelectrical system can be provided by depositing a dry film layer arrangement on a surface of a substrate on which the micromechanical system is formed, wherein the dry film layer arrangement has an opening in the area of the micromechanical system, and a transparent cover, such as a glass cover, finally is applied. The dry film layer arrangement thus patterned forms a so-called spacer frame, i.e. a layered structure as spacer. The dry film layer arrangement thus can be applied more thickly than for example by spinning on, due to the application by means of a carrier film.

According to the invention, for the encapsulation or for the housing, the use of e.g. high-quality glass for the optical window is combined with a layer, which may for example comprise polymer material, as spacer frame. The corresponding manufacturing method is executed for the wafer, is very flexible, high-quality and offers the possibility of significant cost savings for production of optical Microsystems in small or medium numbers.

Thus, the encapsulation comprises a glass cover with a thick polymer spacer layer (spacer), which is formed such that free movement of the micromechanical structure on the MEMS device is possible. The MEMS device may for example comprise a moveable micromirror with a movement of more than 100 µm outside a base plane. A backside cover facing away from the glass cover may be included for the case of the MEMS device having an opening to the backside, as it may for example be the case with a micromirror. Use of glass as optical window is advantageous in that dereflection is possible by an antireflection layer, for example, which may be adapted to the utilized wavelength of light. The thickness of the polymer layer is adapted to the movement of the MEMS device, so that no malfunction as a result of an obstruction can result and the micromirror can move freely, for example. A further important feature is a potential opening of the glass cover above contact pads, which are used for conventional wire bonding, for example. The openings of the glass covers may either be formed on the original glass wafer, i.e. prior to applying the spacer layer and/or the MEMS device, or formed later during the dicing process of the devices. In the latter case, the glass above the bonding pads is removed (for example by cutting), and the individual devices of the wafer are separated or diced in a second step.

A corresponding fabrication method may, for example, be performed as follows. The fabrication begins with the provision of the glass wafer, which represents the optical window for the micromechanical system. The glass wafer may optionally have a dereflection, for example by an applied antireflection layer, and may further offer openings for the bonding pads of the MEMS device. The openings for the bonding pads in the glass wafer may alternatively also be produced later, for example during the process of dicing the devices. For example, this is described in Y.-M. J. Chiang et al., "A wafer-level micro cap array to enable high-yield micro system packaging", IEEE Transactions on Advanced Packaging, vol. 27, no. 3, August 2004, and in Z.-H. Liang et al., "A low temperature wafer-level hermetic MEMS package using UV curable adhesive", IEEE Electronic Components and Technology Conference, 2004. A key problem is the formation of the spacer layer, which defines the distance between the glass cover (glass window) and the MEMS device. According to the invention, this is achieved by a applying a polymer dry film layer arrangement on the glass wafer. If a simple dry film layer does not have the desired layer thickness, multiple film layers may alternatively be applied one after the other. Thus, the layer thickness may be adapted corresponding to the requirements for flawless functioning of the micromechanical system. Dry films traditionally are used for so-called bumping processes and are available in different layer thicknesses. The use of dry films is of particular interest in layer thicknesses ranging from several 10 to several 100 µm, since it is very difficult to uniformly apply layers with such a great layer thickness by a conventional spin-on or spin-coating method.

After applying the exemplary polymer dry layer, the layer is patterned. This may, for example, be done using optical lithography by exposure utilizing an exemplary mask, including development, e.g. by so-called spray development. The glass wafer with the polymer spacer layer may then directly be fixed on the wafer with the MEMS device, for example with the aid of a so-called thermal pressure bonding device (e.g. the Suiss MicroTec SB6). The application of pressure and heat fixes the polymer layer onto the device wafer, which usually does not necessitate additional plasma activation, see Y.-M. J. Chiang et al., "A wafer-level micro cap array to enable high-yield micro system packaging", IEEE Transactions on Advanced Packaging, vol. 27, no. 3, August 2004. Optionally, an additional glue or adhesive layer may be applied onto the spacer layer to increase the adhesion between the cover wafer (glass wafer with or without dry film layer arrangement) and the MEMS device wafer, as described either in the so-called stamping in DE 196 02 318 and in G. Klink et al., "Wafer bonding with an adhesive coating", Proc. SPIE, vol. 3514, 1998 or has been shown for the spin-on method in Z.-H. Liang et al., "A low temperature wafer-level hermetic MEMS package using UV curable adhesive", IEEE Electronic Components and Technology Conference, 2004, for example. Use of additional adhesion layers may also be advantageous if the device wafer comprises an uneven areas (topography) to be compensated. The backside cover, for example using a silicon wafer, may be processed in similar manner. The backside cover may also comprise additional spacer layers if this is necessary for the functioning of the MEMS device, for example. As a last step, the dicing of the devices is done.

The encapsulation thus obtained of a micromechanical system hence is advantageous particularly in that also large cavities for the mechanical structure can be realized flexibly and the use of glass also enables a high-quality optical window. Finally, the exemplary wafer processing offers significant cost savings.

BRIEF DESCRIPTION OF THE DRAWINGS

Embodiments of the present invention will be detailed subsequently referring to the appended drawings, in which.

DETAILED DESCRIPTION

Figure 1:
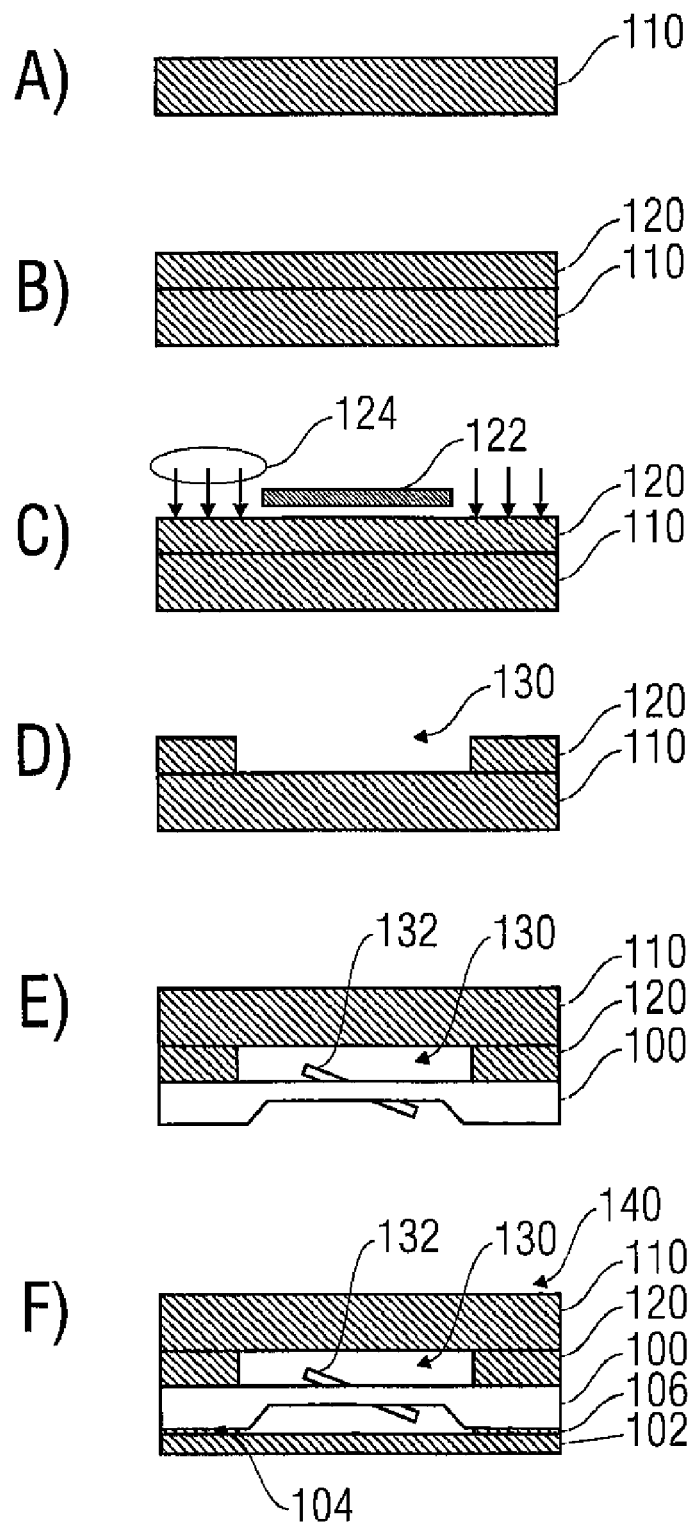
FIGS. 1A to 1F show a process sequence for producing an encapsulation for a wafer.

Before explaining the present invention in greater detail in the following on the basis of the drawings, it is to be pointed out that the same elements in the figures are provided with the same or similar reference numerals, and that repeated description of these elements is omitted.

FIGS. 1A to 1F describe the procedural steps for housing a micromechanical system 100.

In FIG. 1A, at first a glass substrate 110 is provided, onto which a dry film layer arrangement 120 is applied, as shown in FIG. 1B. For example, the application provides for sequential application of several dry film layers. Here, a dry film layer, or already the dry film layer arrangement 120, is on an application substrate (not shown) specially provided for application, maybe protected between application substrate and a cover layer (not shown), wherein for application, the cover layer is removed and the arrangement of application substrate and dry film layer (arrangement) 120 is applied on the glass substrate 110 by rolling off, with the dry film layer (arrangement) 120 facing the glass substrate 110.

As a next step, as shown in FIG. 1C, the dry film layer arrangement 120 is patterned. This may, for example, be done by using a mask 122 and ensuing exposure, as indicated by the beams 124. The application substrate (not shown) may either be removed or peeled off after the exposure or may already have been removed previously. Within the scope of the patterning, there may also be done a development step for curing and better cross-linkage of the dry film material. Then, for example by an etching process, the dry film layer arrangement 120 may be removed in the area of the mask 122, which has not been cross-linked, such as the exposed or unexposed part, so that an opening 130 develops. This is shown in FIG. 1D. The achieved thickness of the dry layer arrangement depends on the thickness in which the dry film layer (arrangement) 120 was prepared on the application substrate, or how often the procedure is repeated.

The structure created in FIG. 1D is applied onto the micromechanical system 100, wherein the opening 130 extends into an area in which the micromechanical system 100 is. In the embodiment shown here, the micromechanical system 100 for example is a micromirror 132, and the opening 130 is formed such that the micromirror 132 can move freely within the scope of its use (i.e. for example about a predetermined angle). As shown in FIG. 1F, the structure created in FIG. 1E is applied onto a surface 104 of the carrier substrate 102. So as to compensate for potential uneven areas, and further improve the adhesion of the micromechanical system 100 on the carrier substrate 102, an adhesive layer 106 may optionally be disposed between the micromechanical system 100 and the surface 104 of the carrier substrate 102.

Optionally, the carrier substrate 102 may further comprise further spacer layers (not shown in the figure). These further spacer layers or spacers have the function that the exemplary mirror 132 may move freely around an angle set by the application and is not impeded by the underlying carrier substrate 102. Moreover, an additional adhesive layer (not shown in the figure) may be between the micromechanical system 100 and the dry film layer arrangement 120. Like the adhesive layer 106, the additional adhesive layer between the micromechanical system 100 and the dry film layer arrangement 120 is advantageous in that it may compensate for potential uneven areas and furthermore increases the adhesion between the micromechanical system 100 and the dry film layer arrangement 120.

The steps 1A-1F may be executed for an entire wafer, i.e. not only for one device with a micromechanical system 100, as shown in FIG. 1F, but for a multiplicity of micromechanical systems. In order to obtain the individual devices, finally dicing is performed. This dicing may for example take place by cutting the layer sequence, as shown in FIG. 1F, for example.

Thus, one obtains a fabrication process for wafer encapsulation. Although an individual device is shown, a typical wafer may comprise hundreds of devices. The glass cover 110 may also be provided with a dereflection (e.g. by an antireflection layer on an external surface 140), and the external surface 140 is on the side of the glass cover 110 facing away from the dry film layer arrangement 120. The dry film layer 120 may optionally comprise several layers, so that a desired layer thickness is achieved. Potential layer thicknesses here range from 1 to 1000 µm, and advantageously from 10 to 300 µm. The patterning, such as by the exposure 124 and etching using the mask 122, provides the dry film layer arrangement 120 in form of a frame. That is, each micromechanical system 100 is embedded in a frame, whereby the micromechanical system 100 is protected from all sides. The glass cover 110 with the frame structure for the dry film layer arrangement 120, as mentioned, is fixed on an upper face of the micromechanical system 100. Finally, on the opposite side of the micromechanical system 100, for example, a silicon wafer 102 is fixed with an adhesive layer 106. As a last step, dicing of the devices is performed.

Figure 2:
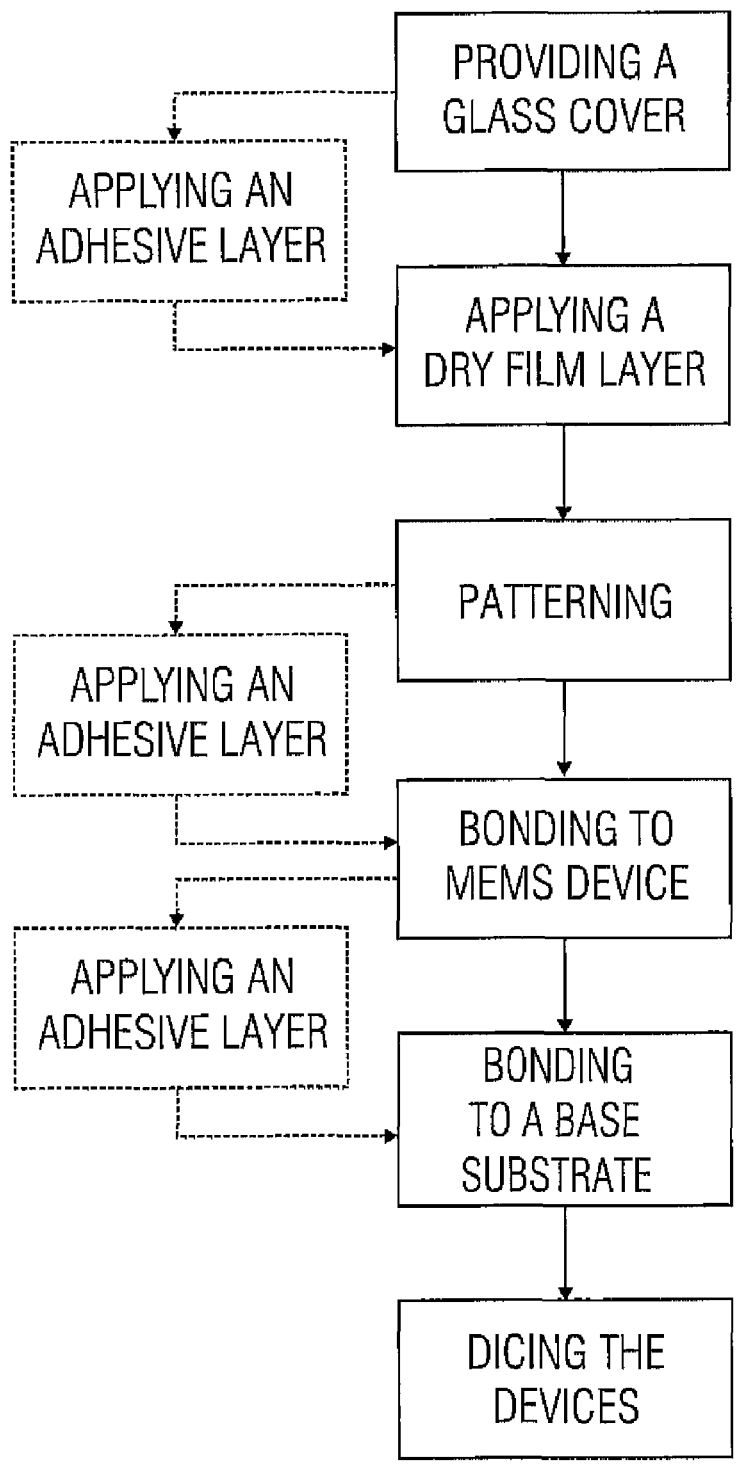
FIG. 2 shows method steps for housing a micromechanical system.

FIG. 2 shows a corresponding step sequence for producing a housed micromechanical system. At first, a glass cover is provided, onto which a spacer material is applied. Optionally, between the glass cover 110 and the spacer material 120, an adhesive layer may be arranged, and the spacer material 120 advantageously comprises a dry film layer arrangement. In a next step, the spacer material 120 is patterned, so that an opening 130 develops, wherein the opening 130 is arranged such that the micromechanical system 100, such as a micromirror, can move freely. After the patterning of the spacer material 120, the structure obtained is applied on the micromechanical system 100, wherein the opening 130 formed by the patterning is disposed so that the micromechanical system 100 can move freely. On the side of the micromechanical system 100 facing away from the spacer material 120, a carrier substrate 102 is applied. Optionally, the micromechanical system 100 may comprise an adhesive layer on both main side faces so that possible uneven areas are compensated for and the adhesion of the micromechanical system 100 both to the spacer material 120 and to the carrier substrate 102 is increased. In a last step, the individual devices are diced. This may for example be done by cutting or milling.

Figure 3:
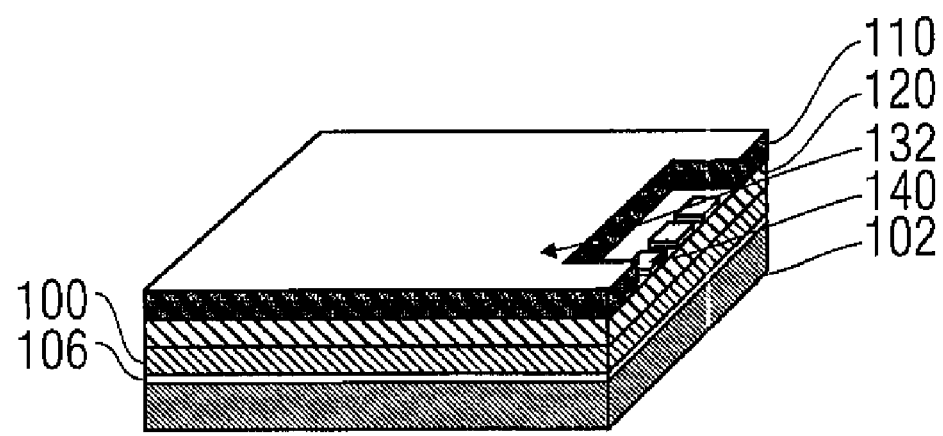
FIG. 3 shows a spatial view of a housed micromechanical system.

FIG. 3 shows a spatial view of a housed micromechanical system 100 comprising a micromirror 132 in one embodiment. The micromirror 132, in this spatial view, is concealed by the glass cover 110 from above and is laterally protected by a frame formed by the dry film layer arrangement 120. The dry film layer arrangement 120 advantageously comprises polymer material. Moreover, the micromechanical system 100 is applied on a carrier substrate 102, wherein an optional adhesive layer 106 is arranged between the carrier substrate 102 and the micromechanical system 100. In this embodiment, also contact pads 140 are shown, which serve for electrical contacting of the micromechanical system 100.

In summary, the present invention provides a cover structure for a micromechanical system 100, namely not for an individual device, but for a wafer with a multiplicity of micromechanical systems 100 (MEMS devices). Moreover, the present invention allows for the formation of cavities with great expansion, for example of more than 100 µm or even more than 200 µm, which are defined by a frame, for example formed by a polymer frame and capable of being produced by applying and patterning one or more dry film layers on the glass wafer 110. Moreover, the present invention is advantageous in that glass can be used as covering material, which may optionally be dereflected, e.g. by applying an antireflection layer. Furthermore, the glass cover 110 may comprise an optical filter, so that an advantageous optical window for the micromechanical system 100 can be provided, i.e. the optical spectrum used may be adapted correspondingly to the micromirror 132 used, for example. Thus, an inventive apparatus can be produced inexpensively and moreover is flexibly adaptable to cavities of various expansions.

The use of glass as cover material or as glass wafer 110 may also be replaced by using another transparent material in further embodiments. The developing optical window or the optical backlayer may for example comprise, apart from glass, also silicon, germanium, quartz, optical polymers, calcium fluoride or another optical material transparent in a predetermined wavelength range. The predetermined wavelength range may here be adapted to the particular application, such as to the sensitivity of an optical sensor to be protected by the cover. Moreover, it is advantageous to supply to the micromechanical system 100 only as much radiation as at least necessary for its functioning and suppress further radiation. On the one hand, the micromechanical system 100 thereby is protected, and also excess heating is avoided.

Alternatively or additionally to the previous description, the optical window (e.g. the glass cover 110) may also be provided with an antireflection/polarization layer, which may be optimized with respect to the predetermined wavelength range. Optionally, however, also microoptical devices may be applied onto the optical cover 110 to positively influence the optical properties in application-specific regard. For example, microlenses, microlens arrays and microprisms may cause increased focusing of the incident radiation. This may be advantageous particularly with weak intensity of the incident radiation. Zoning plates, transmission gratings, beam splitters or dereflections may also be appropriate. These additional microoptical devices may be applied in whole-area manner or also only partially and may for example cause part of the incident radiation to be reflected or otherwise prevented from passing the optical window 110. Thus, radiation can only penetrate the micromechanical system in a partial area of the optical window 110, whereby the above-mentioned heating can be suppressed, for example.

Instead of the micromechanical system 100, also a micro-optoelectrical system may be protected by the transparent cover 110, i.e. not only MEMS or MOEMS (micro-optoelectromechanical systems). The present invention thus may also be used for housing spatial optical detectors (or single optical detectors) or general radiation detectors, such as CCDs (charge coupled devices), bolometer arrays, thermopile arrays, pyroelectrical sensors, CMOS (complementary metal oxide semiconductor) imagers, or CMOS/CCD camera chips. Further applications include the housing of spatial light modulators, such as micromirror arrays, liquid crystal displays, OLED (organic light-emitting diode) displays, or LCOS (liquid crystal on silicon) displays. In the case of a micromechanical system to be protected, examples for an application of the above embodiments are laser-scanning projection displays or barcode scanners, micromirror-based image pickups (e.g. endoscopes) or retina projection displays.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for housing a micromechanical or a micro-optoelectrical system, comprising:
   a substrate with a surface on which the micromechanical system is formed;
   a transparent cover; and
   a dry film layer arrangement between the surface of the substrate and the transparent cover; wherein
   the dry film layer arrangement comprises an opening, so that the micromechanical system adjoins the opening; and
   the dry film layer arrangement comprises polymer material.

2. The apparatus according to claim 1, wherein the transparent cover comprises an optical material transparent in a predetermined wavelength range.

3. The apparatus according to claim 1, wherein the transparent cover comprises glass, quartz, silicon, germanium, calcium fluoride, or an optical polymer.

4. The apparatus according to claim 1, wherein an optical device is attached at the transparent cover.

5. The apparatus according to claim 4, wherein the additional optical device comprises a microlens, microlens array, a zoning plate, a microprism, a transmission grating, a beam splitter, or mirroring.

6. The apparatus according to claim 1, wherein the micromechanical or micro-optoelectrical system comprises a CCD image sensor, a CCD array, a bolometer, a bolometer array, a thermopile, a thermopile array, a pyroelectrical sensor, a CMOS image sensor, or a CMOS/CCD array.

7. The apparatus according to claim 1, wherein the transparent cover further comprises a dereflection, or a spectral or/and polarization filter coating.

8. The apparatus according to claim 1, wherein the transparent cover comprises an opening for connecting contacts in lateral spacing to the opening of the dry film layer arrangement, and the connecting contacts are capable of being electrically coupled to the micromechanical system.

9. The apparatus according to claim 1, wherein the dry film layer arrangement comprises a layer sequence of several overlying dry film layers.

10. The apparatus according to claim 1, wherein the dry film layer arrangement comprises a layer thickness of more than 100 µm.

11. The apparatus according to claim 1, wherein the substrate comprises a layer in which the micromechanical system is formed and a carrier substrate, between which an adhesive layer is arranged.

12. The apparatus according to claim 1, wherein the substrate is bonded to the dry film layer arrangement by means of a thermal pressure bond.

13. The apparatus according to claim 1, wherein the substrate comprises a recess into which a part of the micromechanical system expands or can move.

14. An apparatus for housing a micromechanical or a micro-optoelectrical system, comprising:
   a substrate with a surface on which the micromechanical system is formed;
   a transparent cover;
   a dry film layer arrangement between the surface of the substrate and the transparent cover; and
   an adhesion layer; wherein
   the dry film layer arrangement comprises an opening, so that the micromechanical system adjoins the opening;
   the adhesion layer is formed between the micromechanical system and the substrate and/or between the micromechanical system and the dry film layer arrangement;

the adhesion layer is formed to achieve improved adhesion and/or compensation for uneven areas of adjacent layers wherein the dry film layer arrangement comprises polymer material.

15. A method for housing a micromechanical or micro-optoelectrical system, comprising:
providing a transparent cover;
applying a dry film layer arrangement onto the transparent cover;
patterning the dry film layer arrangement to produce an opening; and
bonding a surface of a substrate on which the micromechanical system is formed to the dry film layer arrangement, so that the micromechanical system adjoins the opening; wherein
the dry film layer arrangement comprises polymer material.

16. The method according to claim 15, further comprising dereflecting or applying a spectral or/and polarization filter coating onto the transparent cover.

17. The method according to claim 15, wherein providing the transparent cover comprises forming openings, wherein the openings are formed such that electrically contacting is enabled at connecting contacts of the micromechanical system.

18. The method according to claim 15, wherein applying the dry film layer arrangement includes applying a layer sequence of several dry film layers.

19. The method according to claim 15, further including gluing the micromechanical system onto the substrate.

20. The method according to claim 15, further including applying a spacer layer between the carrier substrate and the micromechanical system, so that the micromechanical system is separated a predetermined distance from the carrier substrate by the spacer layer.

21. A system with an apparatus for housing a micromechanical or a micro-optoelectrical system, the apparatus comprising:
a substrate with a surface on which the micromechanical system is formed;
a transparent cover; and
a dry film layer arrangement between the surface of the substrate and the transparent cover; wherein
the dry film layer arrangement comprises an opening, so that the micromechanical system adjoins the opening;
the system is a laser-scanning projection display, a barcode reading device, an image pickup, a retina projection display, an optical detector or a spatial light modulator; and
the dry film layer arrangement comprises polymer material.

22. The system according to claim 21, wherein an optical device is attached at the transparent cover.

23. The apparatus according to claim 22, wherein the additional optical device comprises a microlens, microlens array, a zoning plate, a microprism, a transmission grating, a beam splitter, or mirroring.

* * * * *